(12) United States Patent
Kajitani et al.

(10) Patent No.: US 12,061,079 B2
(45) Date of Patent: Aug. 13, 2024

(54) DETECTION METHOD, DETECTION APPARATUS, LITHOGRAPHY APPARATUS, AND ARTICLE MANUFACTURING METHOD

(71) Applicant: CANON KABUSHIKI KAISHA, Tokyo (JP)

(72) Inventors: Masaharu Kajitani, Tochigi (JP); Hironori Maeda, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 18/166,990

(22) Filed: Feb. 9, 2023

(65) Prior Publication Data

US 2023/0273016 A1 Aug. 31, 2023

(30) Foreign Application Priority Data

Feb. 25, 2022 (JP) ................. 2022-028463

(51) Int. Cl.
*G03F 9/00* (2006.01)
*G01B 11/27* (2006.01)

(52) U.S. Cl.
CPC .......... *G01B 11/272* (2013.01); *G03F 9/7019* (2013.01); *G03F 9/7088* (2013.01); *G03F 9/7092* (2013.01)

(58) Field of Classification Search
CPC ... G01B 11/272; G03F 9/7019; G03F 9/7088; G03F 9/70–7034; G03F 9/7046; G03F 9/7049; G03F 9/7065; G03F 9/7069; G03F 9/7073; G03F 9/7076; G03F 9/7092; G03F 9/7096; G03F 7/70; G03F 7/705; G03F 7/70483; G03F 7/70605–706851; G03F 7/7085; G03F 7/70758; G03F 7/70766; G03F 7/70775; G03F 7/708; G03F 7/70808; G03F 7/70816; G03F 7/70833
USPC ...... 355/18, 30, 52–55, 67–77; 356/399–401
See application file for complete search history.

(56) References Cited

U.S. PATENT DOCUMENTS

| | | | |
|---|---|---|---|
| 2007/0159632 A1* | 7/2007 | Shibazaki | G03F 9/7003 356/401 |
| 2010/0091297 A1* | 4/2010 | Van Bilsen | G03F 9/7046 356/509 |
| 2011/0013188 A1* | 1/2011 | Slotboom | G01B 11/272 702/150 |
| 2021/0003930 A1* | 1/2021 | Yamaguchi | G03F 9/7026 |
| 2022/0187722 A1* | 6/2022 | Bijnen | G03F 9/7088 |

FOREIGN PATENT DOCUMENTS

| | | |
|---|---|---|
| JP | 2001044110 A | 2/2001 |
| JP | 2009054736 A | 3/2009 |

\* cited by examiner

*Primary Examiner* — Christina A Riddle
(74) *Attorney, Agent, or Firm* — Canon U.S.A., Inc. I.P. Division

(57) ABSTRACT

A method for detecting a mark using a detection apparatus including a detection unit includes performing a first movement process that moves the detection unit to a first position, performing a second movement process that moves the detection unit to a second position, detecting the mark after the first movement process and the second movement process, and correcting a measurement value of the detected mark using first information about a movement of the detection unit in the first movement process and second information about a movement of the detection unit in the second movement process.

10 Claims, 12 Drawing Sheets

FIG.7

|  |  | POSITION OF DETECTION UNIT AFTER MOVEMENT | | |
|---|---|---|---|---|
|  |  | p1 | p2 | p3 |
| POSITION OF DETECTION UNIT BEFORE MOVEMENT | p1 | f1(t) | f2(t) | f3(t) |
|  | p2 | f4(t) | f5(t) | f6(t) |
|  | p3 | f7(t) | f8(t) | f9(t) |

DETECTION METHOD, DETECTION APPARATUS, LITHOGRAPHY APPARATUS, AND ARTICLE MANUFACTURING METHOD

BACKGROUND

Field

The present disclosure relates to a detection method, a detection apparatus, a lithography apparatus, and a method for manufacturing an article.

Description of the Related Art

In recent years, as semiconductor integrated circuits have become highly integrated and miniaturized, line widths of patterns formed on substrates have become extremely thin. Accordingly, further miniaturization is required in a lithography process that forms a pattern on a substrate.

A lithography apparatus such as an exposure apparatus forms a pattern in a predetermined area (a pattern area) on a substrate. Thus, in order to satisfy a demand for miniaturization of the pattern, it is important to precisely align a position of the substrate.

Conventionally, prior to pattern formation, a method for measuring a position of a mark formed near a pattern area on a substrate, acquiring an array of the pattern area, and aligning the substrate (global alignment) has been implemented. In the global alignment, there is known a method for increasing the number of marks that are measurement targets and performing statistical processing in order to improve alignment accuracy of the substrate. However, the time required to measure the marks increases in this method, and thus there is an issue that a throughput decreases. In contrast, in order to achieve both an increase in the number of marks and a reduction in measurement time, a technique is discussed that uses a plurality of detection units to detect a plurality of marks on a substrate.

In Japanese Patent Application Laid-Open No. 2009-54736, a method is discussed in which alignment is performed using the same mark by a plurality of movable detection units and correction values are acquired for the plurality of detection units based on measurement results. Accordingly, deviation of the measured positions due to differences in performance of the plurality of detection units is corrected, and a plurality of marks on a substrate can be efficiently and highly accurately measured.

The movable detection unit discussed in Japanese Patent Application Laid-Open No. 2009-54736 detects a mark after the detection unit is moved to a predetermined position and aligned. However, even if the detection unit is aligned, the position of the detection unit may change from the aligned position due to change in a shape of a holding unit or a housing of the detection unit over time. In addition, an amount of change in the position of the detection unit changes according to a movement history of the detection unit. If the position of the detection unit changes, an error occurs in a detection result by the detection unit, and mark detection accuracy may decrease.

SUMMARY

Aspects of the present disclosure are directed to a detection method for preventing a decrease in accuracy of mark detection, a detection apparatus, a lithography apparatus, and a method for manufacturing an article.

According to an aspect of the present disclosure, a method for detecting a mark using a detection apparatus including a detection unit includes performing a first movement process that moves the detection unit to a first position, performing a second movement process that moves the detection unit to a second position, detecting the mark by the detection unit after the first movement process and the second movement process, and correcting a measurement value of the detected mark using first information about a movement of the detection unit in the first movement process and second information about a movement of the detection unit in the second movement process.

Further features will become apparent from the following description of exemplary embodiments with reference to the attached drawings.

BRIEF DESCRIPTION OF THE DRAWINGS

FIG. 7 illustrates an approximate expression acquired for each movement condition of the detection unit.

DESCRIPTION OF THE EMBODIMENTS

Figure 1:
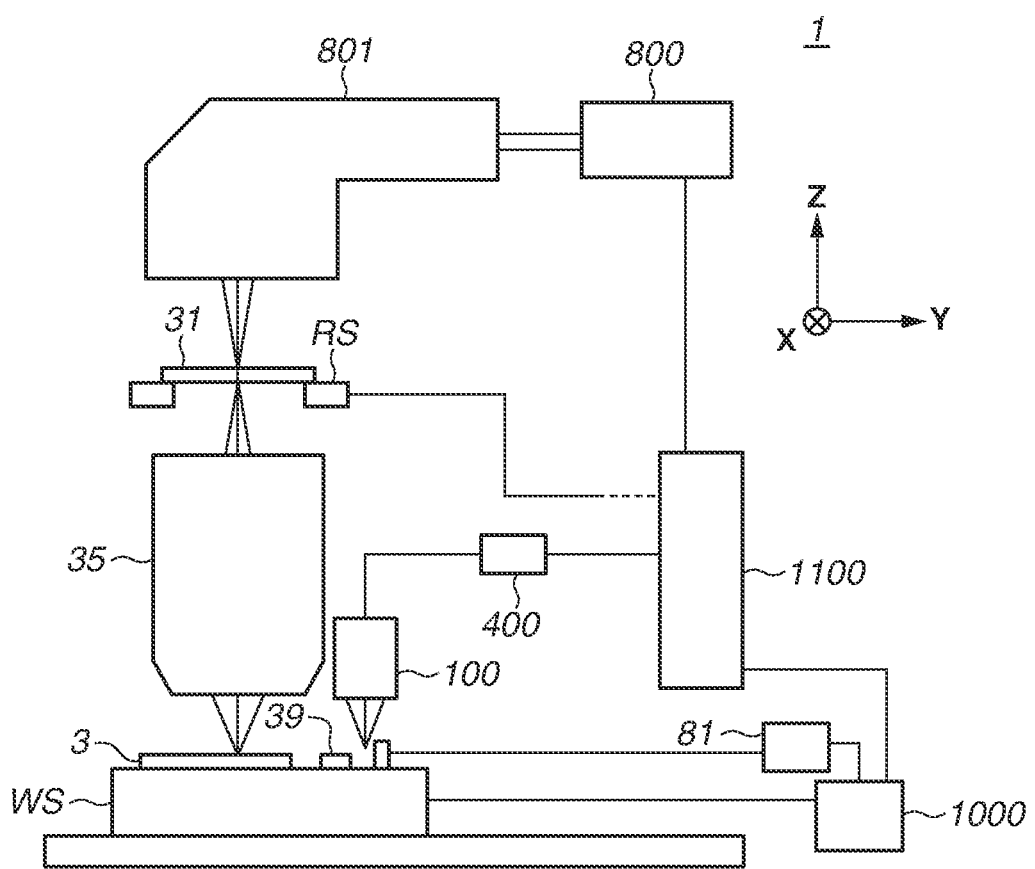
FIG. 1 illustrates a configuration of an exposure apparatus.

Exemplary embodiments will be described in detail below with reference to the attached drawings. The following exemplary embodiments are not intended to be limiting. A plurality of features is described in the exemplary embodiments, but not all of the plurality of features are essential, and the plurality of features can be freely combined. The same reference numerals are used for the same or similar configurations in the attached drawings, and repetition in descriptions is avoided.

An exposure apparatus 1 as a lithography apparatus is described with reference to FIG. 1. The exposure apparatus 1 includes a detection apparatus 100 that detects a mark, and exposes a wafer 3 (a substrate) to light to form a pattern on the wafer 3. In the present specification and the attached drawings, a direction along an optical axis of an objective optical system 71 of the detection apparatus 100, which is described below, is defined as a Z-axis direction, and two mutually orthogonal directions along a plane perpendicular to the Z-axis direction are defined as an X-axis direction and a Y-axis direction. In addition, rotation directions about an X axis, a Y axis, and a Z axis are respectively defined as a θX direction, a θY direction, and a θZ direction.

The exposure apparatus 1 includes an illumination apparatus 800, an illumination optical system 801, a reticle stage RS, a projection optical system 35, a wafer stage WS, the detection apparatus 100, an arithmetic processing unit 400, and a control unit 1100. A reference member 39 is arranged on the wafer stage WS. The control unit 1100 includes a central processing unit (CPU) and a memory and is electrically connected with the illumination apparatus 800, the reticle stage RS, the wafer stage WS, the detection apparatus 100, and the arithmetic processing unit 400, respectively, to control operation of the exposure apparatus 1. For example, the control unit 1100 controls driving of the wafer stage WS to align the wafer 3 based on detection results of a plurality of marks of the wafer 3 on the wafer stage WS by the detection apparatus 100. The control unit 1100 can also function as a processing unit of the detection apparatus 100. For example, the control unit 1100 calculates a measurement value in a case where the detection apparatus 100 detects the mark on the wafer 3, calculates a correction value for correcting the measurement value, performs correction calculation on the measurement value, and controls the detection apparatus 100 as the processing unit.

The illumination apparatus 800 includes a light source unit that illuminates a reticle 31 on which a circuit pattern is formed.

As a light source, for example, a laser is used. The laser can be, for example, an Argon Fluoride (ArF) excimer laser with a wavelength of approximately 193 nm, a Krypton Fluoride (KrF) excimer laser with a wavelength of approximately 248 nm, or the like. A type of light source is not limited to the excimer laser. A molecular fluorine (F2) laser with a wavelength of approximately 157 nm or an extreme ultraviolet (EUV) light with a wavelength of 20 nm or less can be used as the light source.

The illumination optical system 801 shapes a light flux emitted from the illumination apparatus 800 into a predetermined shape suitable for exposure and illuminates the reticle 31 with the light flux. The illumination optical system 801 can include a lens, a mirror, an optical integrator, and an aperture to perform a function of uniformly illuminating the reticle 31 and a polarized illumination function.

The reticle 31 is, for example, an original plate (a mask) made of quartz on which a circuit pattern to be transferred to a wafer is formed, and is supported and driven by the reticle stage RS. Diffracted light from the reticle 31 passes through the projection optical system 35 and is projected onto the wafer 3. The reticle 31 and the wafer 3 are arranged in an optically conjugate relationship. The reticle 31 and the wafer 3 are scanned at a speed ratio of a reduction ratio, and thus the pattern of the reticle 31 is transferred to the wafer 3. The exposure apparatus 1 is provided with a reticle detection apparatus of a light oblique incidence system (not illustrated), so that a position of the reticle 31 is detected by the reticle detection apparatus, and the reticle 31 is arranged at a predetermined position by being driven by the reticle stage RS.

The reticle stage RS supports the reticle 31 via a reticle chuck (not illustrated) and is connected to a moving mechanism (not illustrated). The moving mechanism includes a linear motor and can move the reticle 31 by driving the reticle stage RS in the X-axis direction, the Y-axis direction, the Z-axis direction, and the rotation directions around the respective axes.

The projection optical system 35 has a function of forming an image of a light flux from an object plane onto an image plane. In the present exemplary embodiment, the projection optical system 35 forms an image of the diffracted light passing through the pattern formed on the reticle 31 onto the wafer 3. The projection optical system 35 can be an optical system (catadioptric optical system) including a plurality of lens elements and at least one concave mirror, an optical system including a plurality of lens elements and at least one diffractive optical element such as a kinoform, or the like.

A photoresist is applied on the wafer 3. In the present exemplary embodiment, the wafer 3 is an object including a mark, and a position of the mark on the wafer 3 is detected by the detection apparatus 100. The wafer 3 is also an object whose surface position is detected by a surface position detection apparatus (not illustrated). The wafer 3 can be a liquid crystal substrate or another object.

The wafer stage WS is configured to support the wafer 3 using a wafer chuck (not illustrated) to be able to change a position and a posture of the wafer 3. The wafer stage WS uses a linear motor to move the wafer 3 in the X-axis direction, the Y-axis direction, the Z-axis direction, and the rotation directions around the respective axes, as with the reticle stage RS. A position of the reticle stage RS and a position of the wafer stage WS are monitored by, for example, a six-axis interferometer 81, and both the reticle stage RS and the wafer stage WS are driven at a constant speed ratio by a stage position control unit 1000.

Figure 2A:
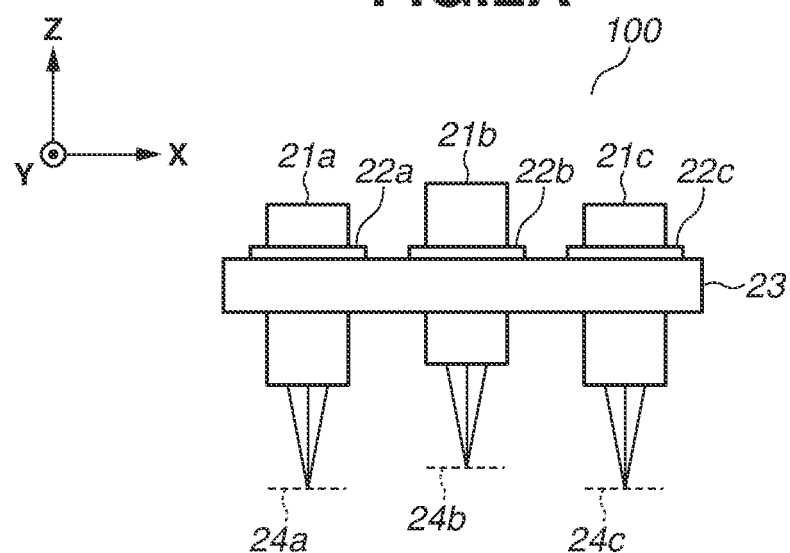
FIGS. 2A and 2B illustrate a configuration of a detection apparatus.
Figure 2B:
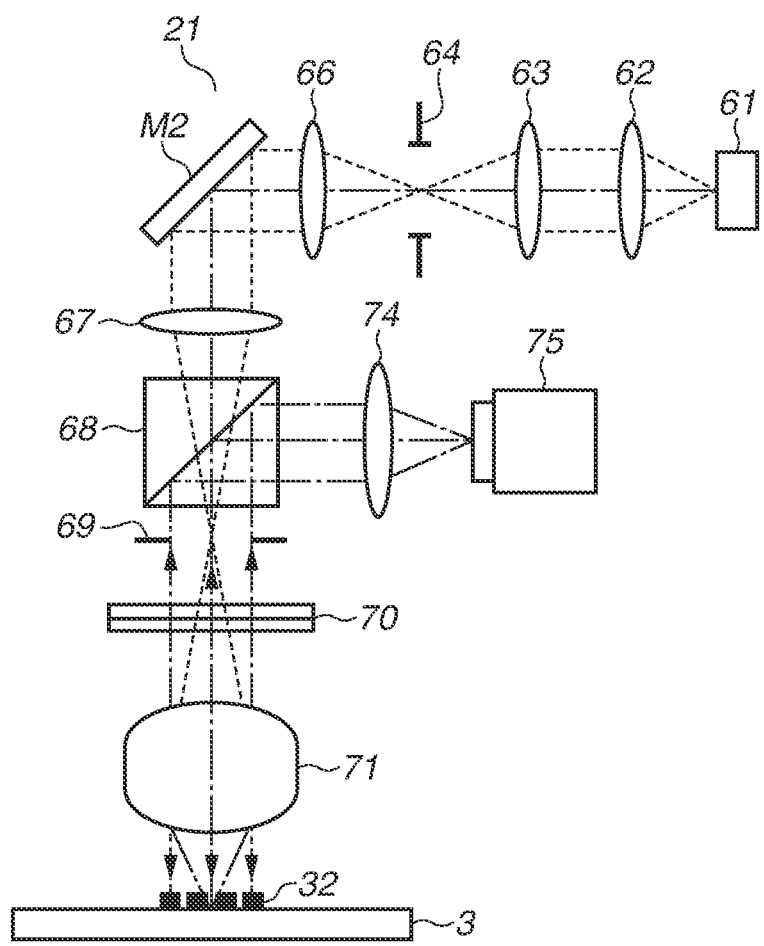

Next, a configuration of the detection apparatus 100 is described. FIGS. 2A and 2B illustrate the configuration of the detection apparatus 100. The detection apparatus 100 includes a plurality of detection units arranged apart from each other so as to detect mutually different marks from among a plurality of marks arranged on the wafer 3. As illustrated in FIG. 2A, the plurality of detection units according to the present exemplary embodiment includes three detection units 21a, 21b, and 21c. The plurality of detection units 21a, 21b, and 21c is arranged at different positions in the X-axis direction. The detection apparatus 100 also includes a plurality of driving mechanisms (moving units) 22a, 22b, and 22c that can move the plurality of detection units 21a, 21b, and 21c in the X-axis direction with a predetermined stroke with respect to a frame 23 that secures the plurality of detection units 21a, 21b, and 21c. The detection apparatus 100 individually controls the plurality of driving mechanisms 22a, 22b, and 22c and thus can individually change (move) positions (X positions) of respective detection areas of the plurality of detection units 21a, 21b, and 21c in the X-axis direction. It is sufficient if relative positions of the detection areas of the plurality of detection units 21a, 21b, and 21c can be moved at least in the X-axis direction by the plurality of driving mechanisms 22a, 22b, and 22c. The detection apparatus 100 can be configured to move the relative positions of the detection areas in the X-axis direction as well as in the Y-axis direction and the Z-axis direction. The detection unit 21b located in the center among the plurality of detection units 21a, 21b, and 21c may not include the driving mechanism, and the relative positions of the detection areas can be adjusted using the driving mechanisms 22a and 22c. In the following description, one of the plurality of detection units 21a, 21b, and 21c is simply referred to as the detection unit 21 in a case where it is not necessary to specify a specific detection unit. One of the plurality of driving mechanisms 22a, 22b, and 22c is simply referred to as the driving mechanism 22 in a case where it is not necessary to specify a specific driving mechanism.

FIG. 2B illustrates a configuration of the detection unit 21. The detection unit 21 can include an illumination system that illuminates the wafer 3 with light emitted from a light source 61 and an image forming system that forms an image of a mark 32 provided on the wafer 3. The illumination system can include illumination optical systems 62, 63, and 66, an illumination aperture stop 64, a mirror M2, a relay lens 67, a polarizing beam splitter 68, a λ/4 plate 70, and the objective optical system 71. The image forming system includes the objective optical system 71, the λ/4 plate 70, a detection aperture stop 69, the polarizing beam splitter 68, and an image forming optical system 74, and is configured to form an image of light from the mark 32 on a sensor 75.

In the detection unit 21, the light emitted from the light source 61 passes through the illumination optical systems 62 and 63 and reaches the illumination aperture stop 64 arranged at a position conjugate with the wafer 3. At this time, a light flux diameter at the illumination aperture stop 64 is sufficiently smaller than a light flux diameter at the light source 61. The light passing through the illumination aperture stop 64 passes through the illumination optical system 66, the mirror M2, and the relay lens 67 and is directed to the polarizing beam splitter 68. The polarizing beam splitter 68 transmits parallel (P) polarized light parallel to the Y-axis direction and reflects senkrecht (S) polarized light parallel to the X-axis direction. Thus, the P-polarized light transmitted through the polarizing beam splitter 68 passes through the λ/4 plate 70 via the detection aperture stop 69 to be converted into circularly polarized light, passes through the objective optical system 71, and is used for Köhler illumination on the mark 32 formed on the wafer 3.

The light that is reflected, diffracted, and scattered by the mark 32 (the light from the mark 32) passes through the objective optical system 71 again, passes through the λ/4 plate 70 to be converted from the circularly polarized light into S-polarized light, and reaches the detection aperture stop 69. A polarization state of the light from the mark 32 is circularly polarized light having an opposite rotation direction to the circularly polarized light illuminating the mark 32. Specifically, in a case where the polarization state of the light illuminating the mark 32 is clockwise circularly polarized light, the polarization state of the light from the mark 32 is counterclockwise circularly polarized light. The detection aperture stop 69 switches a numerical aperture of the light from the mark 32 by changing an aperture amount based on a command from the control unit 1100. The light passing through the detection aperture stop 69 is reflected by the polarizing beam splitter 68 and directed to the sensor 75 via the image forming optical system 74. Thus, the polarizing beam splitter 68 separates an optical path of the illumination light to the wafer 3 and an optical path of the light from the wafer 3, and an image of the mark 32 provided on the wafer 3 is formed on the sensor 75.

Figure 3A:
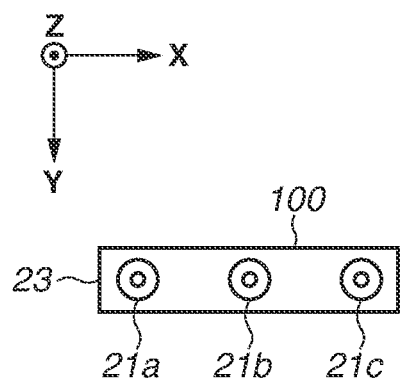
FIGS. 3A, 3B, 3C, and 3D illustrate a method for detecting a mark using the detection apparatus.
Figure 3B:
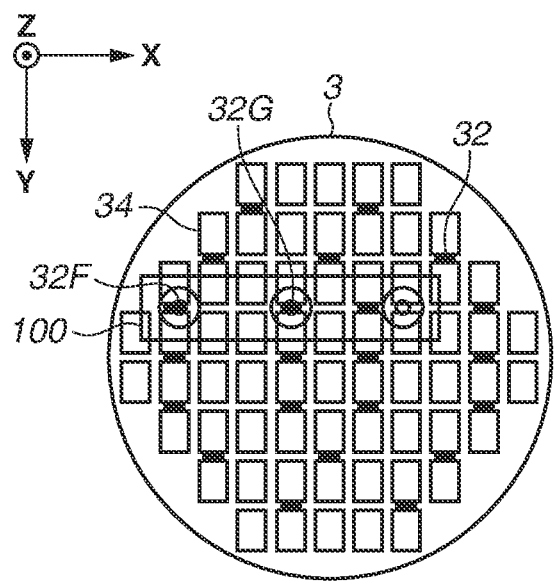
Figure 3C:
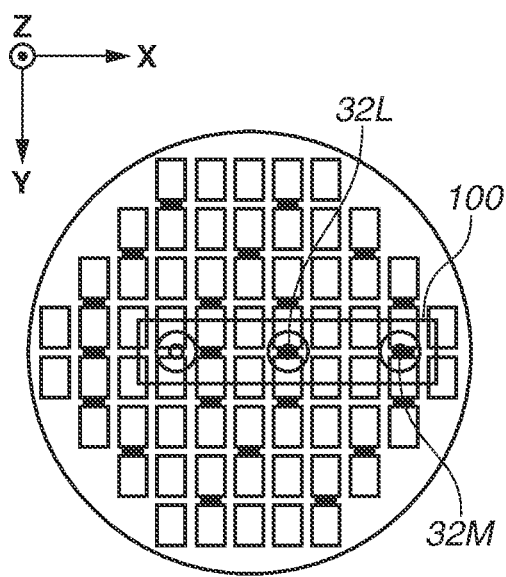
Figure 3D:
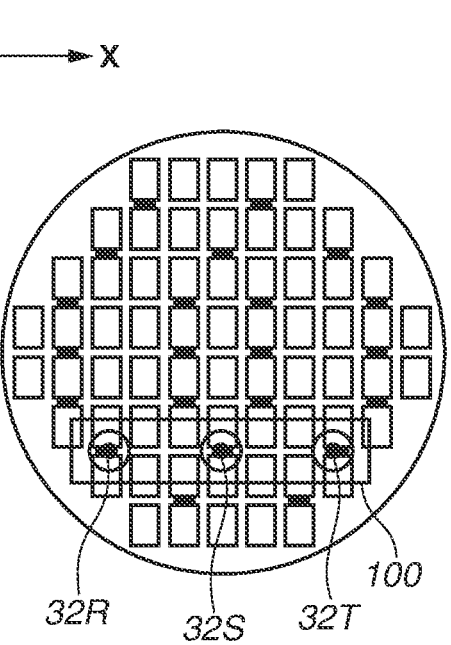

Next, a method for measuring the mark 32 on the wafer 3 using the detection apparatus 100 is described with reference to FIGS. 3A to 3D. FIG. 3A is a plan view of the detection apparatus 100 illustrated in FIG. 2A viewed from the Z-axis direction. As illustrated in FIG. 3A, the plurality of detection units 21a, 21b, and 21c of the detection apparatus 100 are arranged apart from each other so as to detect mutually different marks among the plurality of marks. FIGS. 3B and 3C illustrate positional relationships between the wafer 3 and the detection apparatus 100 at different points in time during a measurement operation. The detection apparatus 100 measures marks 32 formed in a part of a pattern area 34 on the wafer 3 as measurement targets, as illustrated in FIGS. 3B and 3C, in consideration of productivity. The control unit 1100 controls the wafer stage WS to align the marks 32 on the wafer 3 with respect to the detection areas of the plurality of detection units 21a, 21b, and 21c of the detection apparatus 100 and calculates coordinate positions of the marks 32. At this time, the control unit 1100 controls the wafer stage WS so as to detect a plurality of marks as the measurement targets in a shortest possible time. Specifically, the control unit 1100 aligns the marks 32 on the wafer 3 within the detection areas and focal depths of at least two detection units among the plurality of detection units 21a, 21b, and 21c of the detection apparatus 100, and detects positions of two marks at the same time. For example, as illustrated in FIG. 3B, the control unit 1100 simultaneously aligns two marks 32F and 32G on the wafer 3 with respect to the detection units 21a and 21b and performs a measurement operation. The detection unit to be used for measurement can be changed depending on a layout of the marks on the wafer 3. For example, as illustrated in FIG. 3C, the control unit 1100 simultaneously aligns marks 32L and 32M on the wafer 3 with respect to the detection units 21b and 21c and performs a measurement operation. As illustrated in FIG. 3D, the control unit 1100 can also simultaneously align three marks 32R, 32S, and 32T on the wafer 3 within the detection areas and the focal depths of the three detection units 21a, 21b, and 21c and perform a measurement operation. Accordingly, a drive time of the wafer stage WS and a measurement time of the detection apparatus 100 can be shortened compared with a case where a plurality of marks 32 on the wafer 3 is sequentially aligned with respect to the detection area of one detection unit, and a measurement operation is performed.

The control unit 1100 controls each unit in the exposure apparatus 1 including the detection apparatus 100. The control unit 1100 can also calculate the coordinate position of the mark based on position information about the wafer stage WS measured by the interferometer 81 and a signal waveform detected by the detection unit 21. The control unit 1100 also calculates shift, magnification, and rotation of an array of the pattern area 34 (lattice array) on the wafer 3 using a global alignment method based on measurement results by the above-described detection apparatus 100. The control unit 1100 performs a correction of each item and a trapezoidal correction based on a calculation result and determines regularity of the lattice array. The control unit 1100 calculates a correction coefficient from a reference baseline and the determined regularity of the lattice array, and aligns exposure light and the wafer 3 based on the calculation result.

Figure 12A:
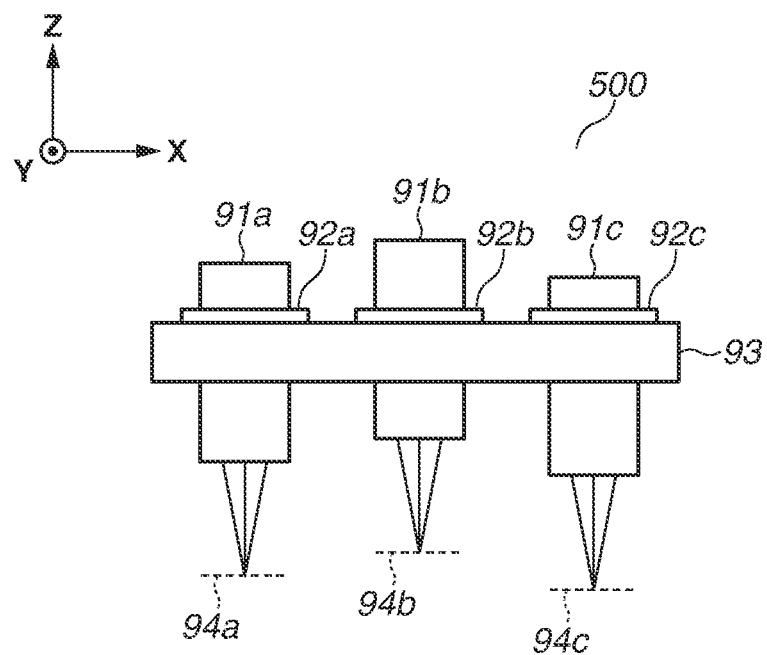
FIGS. 12A and 12B illustrate a factor of an error in the detection apparatus.
Figure 12B:
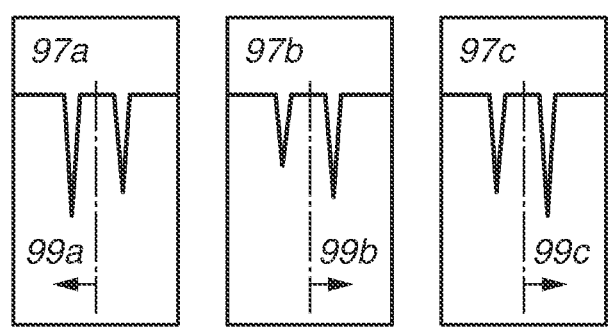

A factor of an error in the detection apparatus is described with reference to FIGS. 12A and 12B. As factors that cause relative displacement of positions between focal planes of the plurality of detection units included in the detection apparatus and marks on a substrate in the Z-axis direction, there are two factors, i.e., an error in the detection apparatus and distortion of a substrate. FIG. 12A illustrates a configuration of a detection apparatus 500, in which positions of focal planes 94a, 94b, and 94c of a plurality of detection units 91a, 91b, and 91c, respectively, are displaced in the Z-axis direction. The following factors can cause the displacement of positions of the focal planes 94a, 94b, and 94c in the Z-axis direction:

(1) A difference in performance of the plurality of detection units 91a, 91b, and 91c, or misalignment of mounting positions of the detection units 91a, 91b, and 91c to a measurement frame 93.
(2) Displacement of positions and a change in postures of the detection units 91a, 91b, and 91c caused by driving mechanisms 92a, 92b, and 92c.

In the following description, one of the plurality of detection units 91a, 91b, and 91c is simply referred to as the detection unit 91 in a case where it is not necessary to specify a specific detection unit.

In the following description, one of the driving mechanisms 92a, 92b, and 92c is simply referred to as the driving mechanism 92 in a case where it is not necessary to specify a specific driving mechanism.

As a conventional method for dealing with the above-described factors, there is a method for calculating correction values for a plurality of mark measurement systems and performing correction. In calculation of a correction value, there is a method for performing alignment using the same mark by each of the detection units and calculating the correction value based on the measurement value of the mark and the position information about the wafer stage WS. A conventional detection apparatus corrects the measurement values of the mark using a difference between the measurement values as the correction values for the plurality of detection units. Then, the correction value is added to the measurement value of the mark as the measurement target on the wafer, and accordingly, deviations in measurement values caused by the difference in performance of the plurality of detection units are corrected, and exposure light and the wafer are aligned.

Even if the correction value is calculated in a state in which the detection unit is aligned, the position of the detection unit can change over time due to a change in a shape of the measurement frame or a housing of the detection unit. Accordingly, the position of the detection area and the focal position of the detection unit can change.

In a case where the detection unit moves a plurality of times, the position of the detection unit can change due to an influence of the movement of the detection unit. The above-described change in position occurs because a position of a heat source included in the detection unit changes as the detection unit moves. The heat source included in the detection unit is, for example, a drive unit included in the driving mechanism or a drive unit (not illustrated) that drives an optical element of the detection unit.

The above-described factors cause an error even if the correction value is added to the measurement value of the mark, and mark detection accuracy is deteriorated. While it is possible to repeat mark detection and calculation of correction values over time to correct the measurement values of the plurality of detection units, there is an issue that the mark detection takes time.

Thus, in the present exemplary embodiment, a correction value is acquired without the mark detection in consideration of a change in the position of the detection unit due to the influence of the movement of the detection unit, and the measurement result of the detection unit 21 is corrected using the acquired correction value.

Figure 4A:
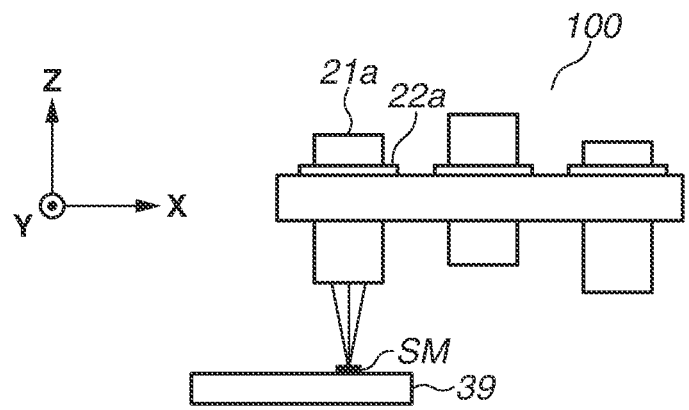
FIGS. 4A, 4B, and 4C illustrate how to acquire information about a position of a detection area and a focal position of each detection unit.
Figure 4B:
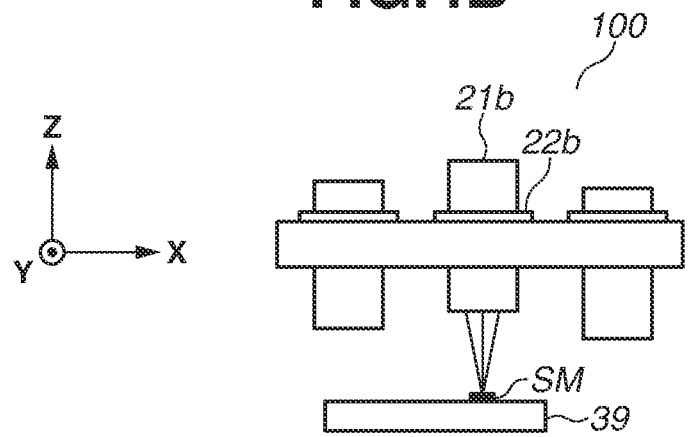
Figure 4C:
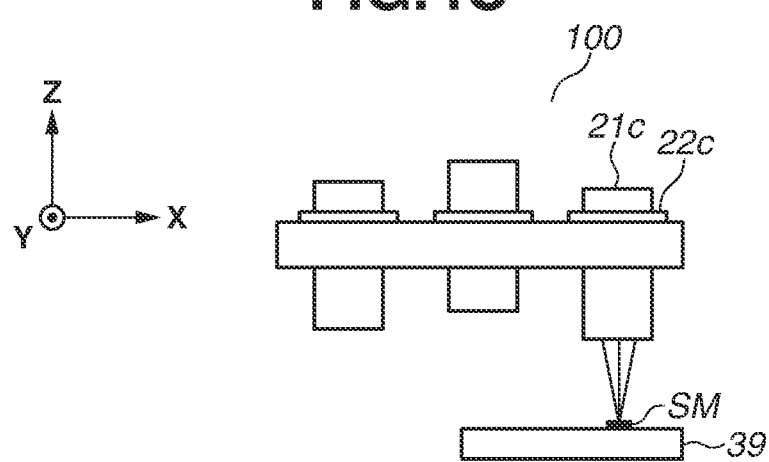

Information about the position of the detection area and the focal position of the detection unit 21 is acquired in advance by the control unit 1100 controlling the wafer stage WS and aligning a reference mark so that the reference mark is placed within the detection area and the focal depth of each of the plurality of detection units 21. A specific example of the processing is described in detail with reference to FIGS. 4A to 4C. As illustrated in FIGS. 4A to 4C, the control unit 1100 sequentially moves at least one mark SM on the reference member 39 supported by the wafer stage WS to be within the detection areas and the focal depths of the plurality of detection units 21. The movement is performed based on, for example, position information about the detection unit 21 and the reference member 39 registered in advance in the exposure apparatus 1. The mark on the wafer 3 can be used instead of the mark SM on the reference member 39. Then, the control unit 1100 acquires the information about the position of the detection area and the focal position of the detection unit 21 based on, for example, a signal waveform of the mark in a case where the wafer 3 is moved in the Z-axis direction and the measurement value of the mark in an XY plane. By repeating the above-described processing, the control unit 1100 can measure an amount of change in the position of the detection unit 21.

Figure 5:
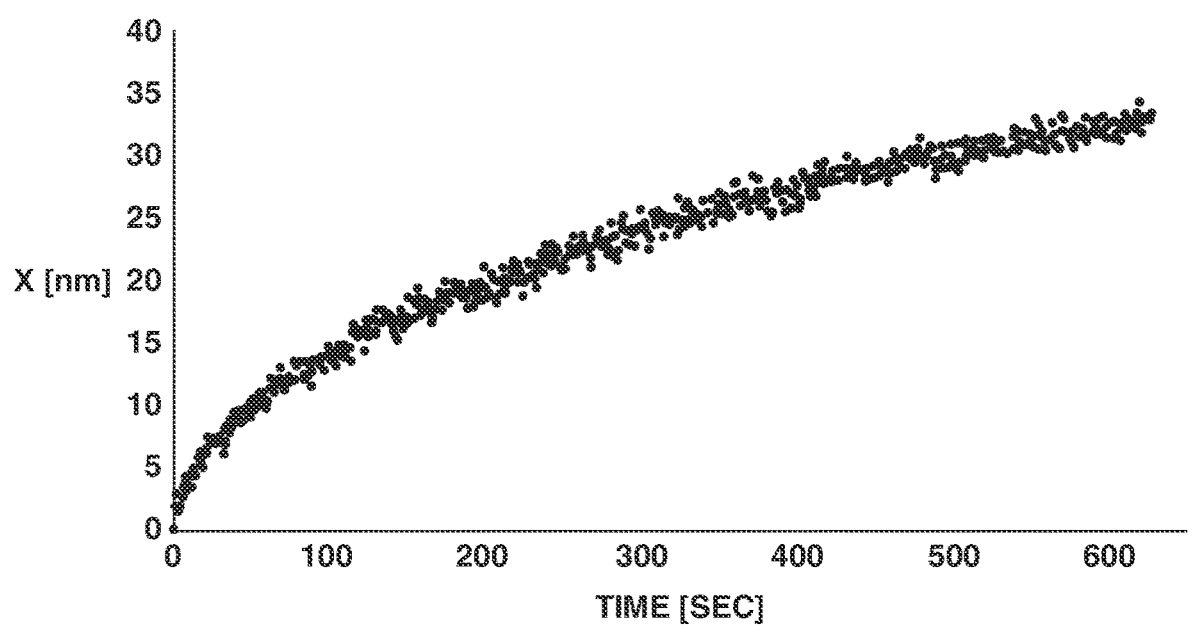
FIG. 5 illustrates measurement values of an amount of change in position of the detection unit.

FIG. 5 illustrates measurement values of the amount of change in the position of the detection unit 21. In FIG. 5, the vertical axis represents the measurement value of the amount of change in the position of the detection unit 21 in one direction (for example, the X-axis direction), and the horizontal axis represents time. FIG. 5 illustrates the measurement values of the amount of change in the position of one detection unit 21 from among the plurality of detection units 21a, 21b, and 21c, but the measurement values of the amount of change in the position of each of the plurality of detection units 21a, 21b, and 21c can be acquired in the same manner. The vertical axis in FIG. 5 represents the measurement value of the amount of change in the position of the detection unit 21 in one direction (for example, the X-axis direction), but the amount of change in the position of the detection unit 21 in the other directions (for example, the Y-axis direction and the Z-axis direction) can also be acquired in the same manner.

Figure 6:
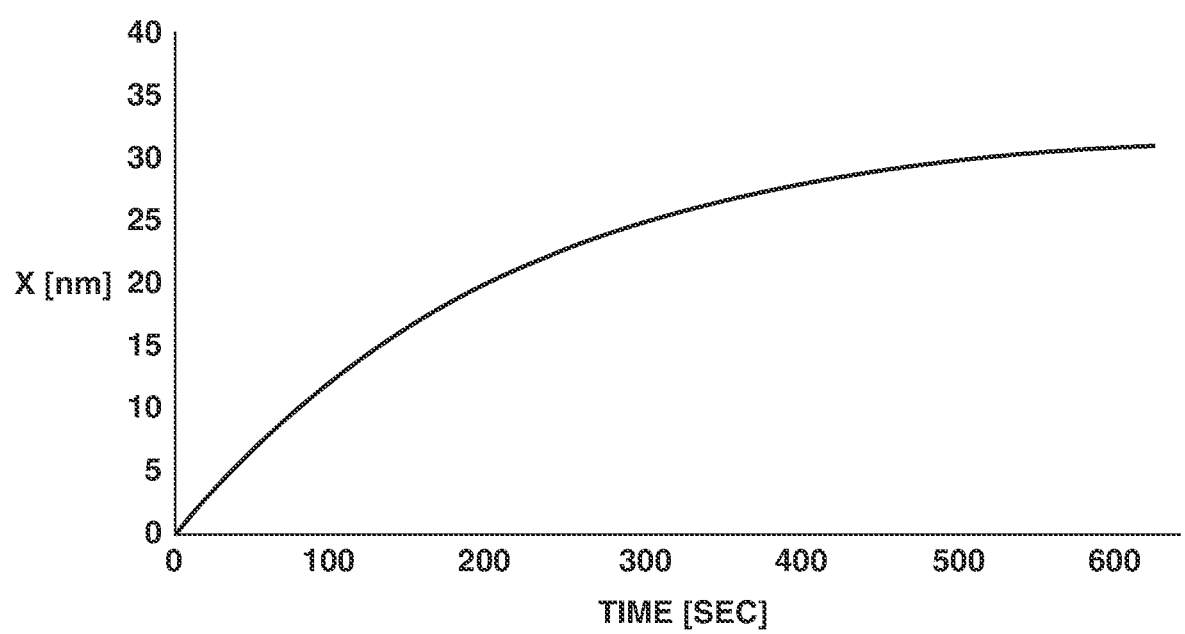
FIG. 6 illustrates an amount of change in position of the detection unit calculated using an approximate expression.

The control unit 1100 acquires an approximate expression representing the amount of change in the position of the detection unit 21 based on the acquired measurement values of the amount of change in the position of the detection unit 21. The approximate expression can be an approximate expression representing an amount of change in the measurement value of the mark detected by the detection unit 21. FIG. 6 illustrates the amount of change in the position of the detection unit 21 calculated using the approximate expression. In FIG. 6, the vertical axis represents the amount of change in the position of the detection unit 21 in one direction (for example, the X-axis direction) calculated using the approximate expression, and the horizontal axis represents time. The control unit 1100 uses, for example, a least squares method to acquire the approximate expression so that a difference of each of the measurement values is minimized based on the acquired measurement values of the amount of change in the position of the detection unit 21.

As an approximate expression, for example, an exponential approximate expression as the following formula (1) can be used:

$$f(t)=A*(1-\exp(-t/T)) \qquad (1)$$

In the formula (1), f(t) represents an amount of change in the position of the detection unit 21, t represents time, A represents a coefficient, and T represents a time constant. In other words, the control unit 1100 calculates the coefficient A and the time constant T to acquire the approximate expression. The approximate expression is not limited to the exponential approximate expression such as the formula (1), and an approximate expression that can accurately approximate the measurement value of the amount of change in the position of the detection unit 21, such as a polynomial approximate expression, a power approximate expression, and a logarithmic approximate expression, can be used.

The formula (1) represents the approximate expression of the amount of change in the position of one detection unit 21 from among the plurality of detection units 21a, 21b, and 21c, but the approximate expression for the amount of change in the position of each of the plurality of detection units 21a, 21b, and 21c can also be acquired in the same manner. The formula (1) represents the approximate expression of the amount of change in the position of the detection unit 21 in one direction (for example, the X-axis direction), but the approximate expression of the amount of change in the position of the detection unit 21 in the other directions (for example, the Y-axis direction and the Z-axis direction) can also be acquired in the same manner.

The control unit 1100 calculates an approximate expression f(t) for each movement condition of the detection unit 21 in order to consider that the amount of change in the position of the detection unit 21 differs depending on the positions of the detection unit 21 before and after movement. The movement condition of the detection unit 21 includes information about the positions of the detection unit 21 before and after movement. The control unit 1100 calculates the approximate expression f(t) based on the measurement values of the mark detected by the plurality of detection units 21 (a second calculation process). Information about the calculated approximate expression f(t) is stored in a storage device (not illustrated) of the control unit 1100 or in an external storage device (not illustrated) for each movement condition of the detection unit 21.

FIG. 7 is a table indicating approximate expressions regarding positions before and after movement of the detection unit 21 that has moved.

Approximate expressions f1(t) to f9(t) indicated in FIG. 7 are approximate expressions acquired based on the positions of the detection unit 21 before and after movement. For example, the approximate expression f1(t) is the approximate expression representing the amount of change in the position of the detection unit 21 in a case where the detection unit 21 moves from a position p1 to the position p1 in a certain direction (for example, the X-axis direction), (i.e., in a case where the detection unit 21 does not move). The approximate expression f2(t) is the approximate expression representing the amount of change in the position of the detection unit 21 in a case where the detection unit 21 moves from the position p1 to a position p2 in the certain direction. The approximate expressions f1(t) to f9(t) are acquired from results of measuring the amount of change in each position of the moved detection unit 21 while changing the position of the detection unit 21 before and after the movement. For example, the approximate expression f2(t) in FIG. 7 is acquired from a result of measuring the amount of change in the position of the detection unit 21 in a case where the detection unit 21 moves from the position p1 to the position p2 in the certain direction. The approximate expressions f1(t) to f9(t) in FIG. 7 are acquired as described above. FIG. 7 indicates the approximate expressions in a case where there are three positions before and after the movement of the detection unit 21, but the number of positions is not limited to three. For example, the approximate expression can be acquired for each combination of two, four, or more positions to which the detection unit 21 moves.

Figure 8A:
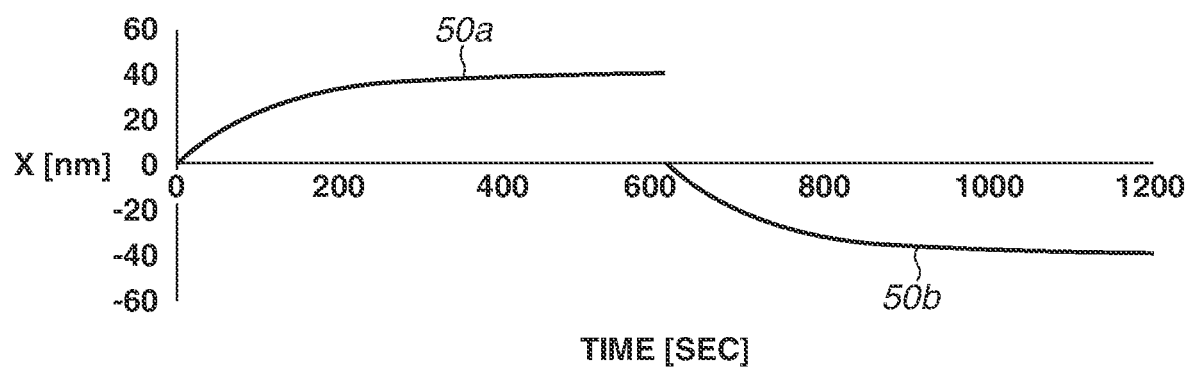
FIGS. 8A and 8B illustrate an amount of change in position in a case where the detection unit moves a plurality of times.
Figure 8B:
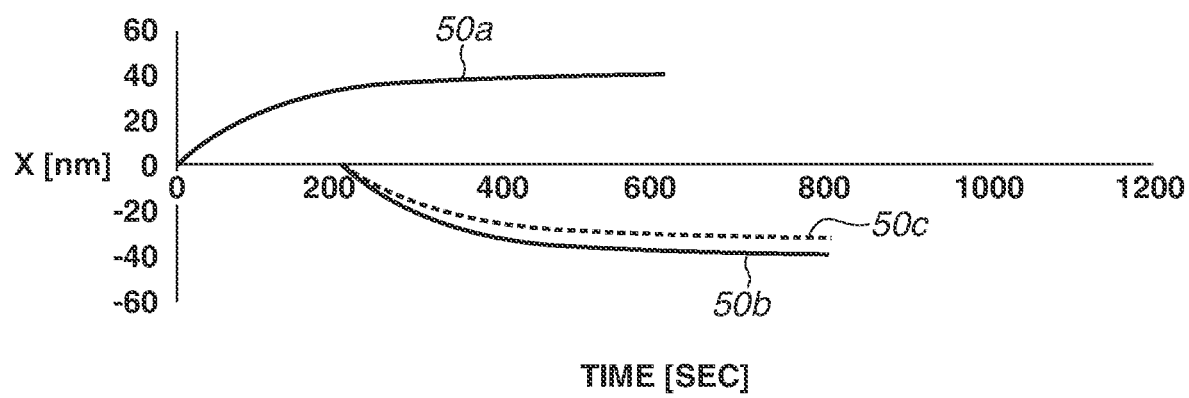

Next, the amount of change in the position in a case where the detection unit 21 moves a plurality of times is described. FIGS. 8A and 8B illustrate the amount of change in the position in a case where the detection unit 21 moves a plurality of times (twice). In FIGS. 8A and 8B, the vertical axis represents the amount of change in the position of the detection unit 21 in one direction (for example, the X-axis direction), and the horizontal axis represents time. In FIG. 8A, a graph 50a represents, for example, a change in the position of the detection unit 21 calculated using the approximate expression f6(t) corresponding to a case where the detection unit 21 moves from the position p2 to a position p3 as the first time. In FIG. 8A, a graph 50b represents, for example, a change in the position of the detection unit 21 calculated using the approximate expression f8(t) corresponding to a case where the detection unit 21 moves from the position p3 to the position p2 as the second time. FIG. 8A also indicates changes in the position of the detection unit 21 in a case where time elapsed from a first movement to a second movement of the detection unit 21 is long. In this case, since the second movement is performed after a change in the amount of change in the position of the detection unit 21 becomes sufficiently small, an influence of the first movement of the detection unit 21 on the change in the position of the detection unit 21 after the second movement is sufficiently small. Thus, the change is almost the same as the change in the position of the detection unit 21 calculated using the approximate expression f8(t).

In a case where the time elapsed between the first movement and the second movement of the detection unit 21 is short, the second movement is performed before the change in the amount of change in the position of the detection unit 21 becomes sufficiently small. In this case, the change in the position of the detection unit 21 after the second movement is more affected by the first movement of the detection unit 21. In FIG. 8B, the graph 50a and the graph 50b represent changes in the position of the detection unit 21 calculated using the approximate expressions f6(t) and f8(t), respectively, similar to FIG. 8A. A graph 50c represents an actual change in the position of the detection unit 21 after the second movement. As illustrated in FIG. 8B, the graph 50c is significantly different from the graph 50b, and even if the amount of change in the position of the detection unit 21 after the second movement is calculated based on the approximate expression f8(t), it can be difficult to acquire the correction value for accurately correcting the measurement result of the detection unit 21.

The control unit 1100 according to the present exemplary embodiment calculates the amount of change in the position of the detection unit 21 based on the approximate expression f(t) corresponding to a plurality of movements of the detection unit 21 and the elapsed time from the plurality of movements.

Figure 9:
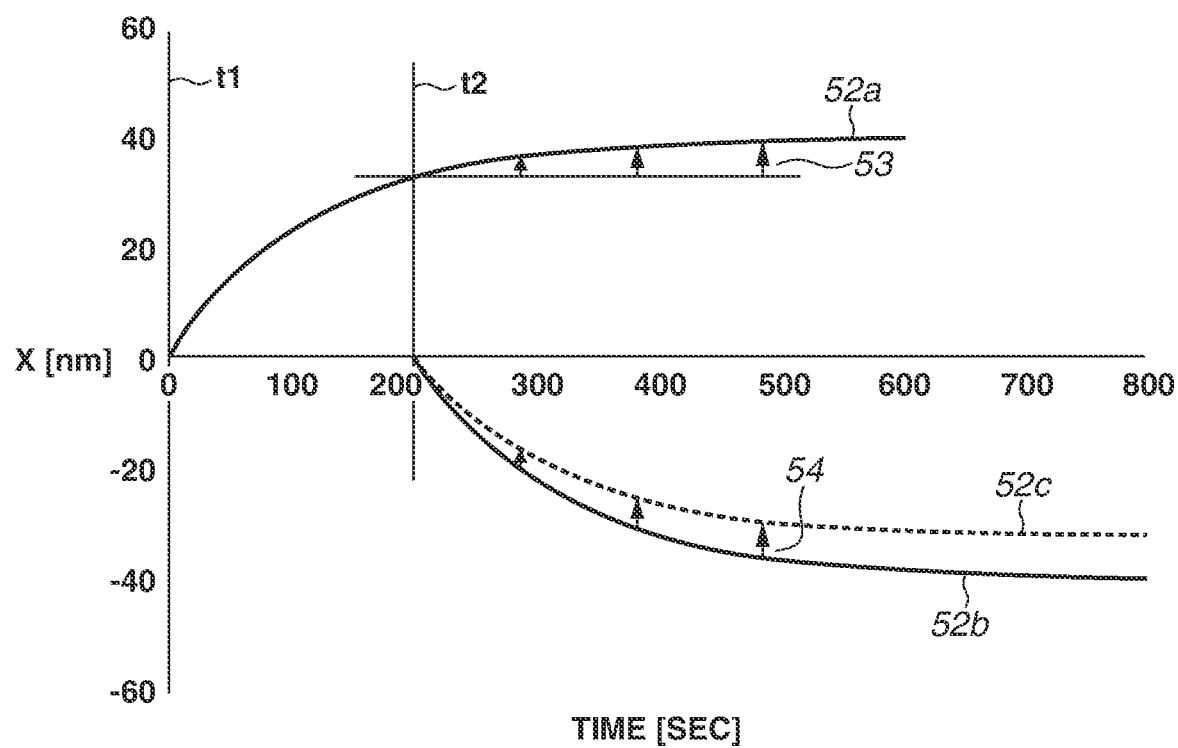
FIG. 9 illustrates a method for calculating an amount of change in position of the detection unit.

FIG. 9 illustrates a method for calculating the amount of change in the position of the detection unit 21 according to the present exemplary embodiment. In FIG. 9, the vertical axis represents the amount of change in the position of the detection unit 21 in one direction (for example, the X-axis direction), and the horizontal axis represents time. Time t1 indicates the time when the detection unit 21 completes the first movement, and time t2 (>t1) indicates the time when the detection unit 21 completes the second movement. A graph 52a illustrates, for example, a change in the position of the detection unit 21 calculated using the approximate expression f6(t) corresponding to the first movement of the detection unit 21 from the position p2 to the position p3. A graph 52b illustrates, for example, a change in the position of the detection unit 21 calculated using the approximate expression f8(t) corresponding to the second movement of the detection unit 21 from the position p3 to the position p2. A graph 52c illustrates an actual change in the position of the detection unit 21 after the second movement.

The actual change in the position of the detection unit 21 after the second movement is affected by the change in the position of the detection unit 21 associated with the first movement of the detection unit 21, and thus, a difference 54 between the graphs 52b and 52c is equal to a change amount 53 after the time t2 in the graph 52a.

The following formula (2) is provided where the actual change in the position of the detection unit 21 at time t is fx(t):

$$fx(t)=fb(t-t2)-\{fa(t-t1)-fa(t2-t1)\} \quad (2)$$

In the formula (2), an approximate expression fa(t) is an approximate expression (a first approximate expression) corresponding to the positions of the detection unit 21 before and after the first movement, and an approximate expression fb(t) is an approximate expression (a second approximate expression) corresponding to the positions of the detection unit 21 before and after the second movement. The approximate expressions fa(t) and fb(t) are selected from a table such as the table illustrated in FIG. 7 based on the positions of the detection unit 21 before and after the movement. For example, in a case where the detection unit 21 moves from the position p2 to the position p3 in the first movement and moves from the position p3 to the position p2 in the second movement, the approximate expressions f6(t) and f8(t) are respectively selected as the approximate expressions fa(t) and fb(t).

As described above, the actual change in the position of the detection unit 21 can be calculated using the time when the movement of the detection unit 21 is completed and the approximate expression corresponding to the positions of the detection unit 21 before and after the movement. Herein, the case where the detection unit 21 moves twice is described, but the actual change in the position of the detection unit 21 can be calculated similarly in a case where the detection unit 21 moves three or more times. For example, the following formula (3) is provided where the actual change in the position of the detection unit 21 at the time t is fy(t), time t3 (>t2) is time when a third movement of the detection unit 21 is completed, and an approximate expression fc(t) corresponds to the positions of the detection unit 21 before and after the third movement:

$$fy(t)=fc(t-t3)-\{fx(t-t2)-fx(t3-t2)\} \quad (3)$$

In the formula (3), the approximate expression fx(t) is the approximate expression (the first approximate expression) corresponding to the positions of the detection unit 21 before and after the second movement, and the approximate expression fc(t) is the approximate expression (the second approximate expression) corresponding to the positions of the detection unit 21 before and after the third movement.

Similarly, in a case where the detection unit 21 moves three or more times, the actual change in the position of the detection unit 21 can be calculated using the information about the movement of the detection unit 21 and the approximate expression acquired based on the number of movements of the detection unit 21.

Figure 10:
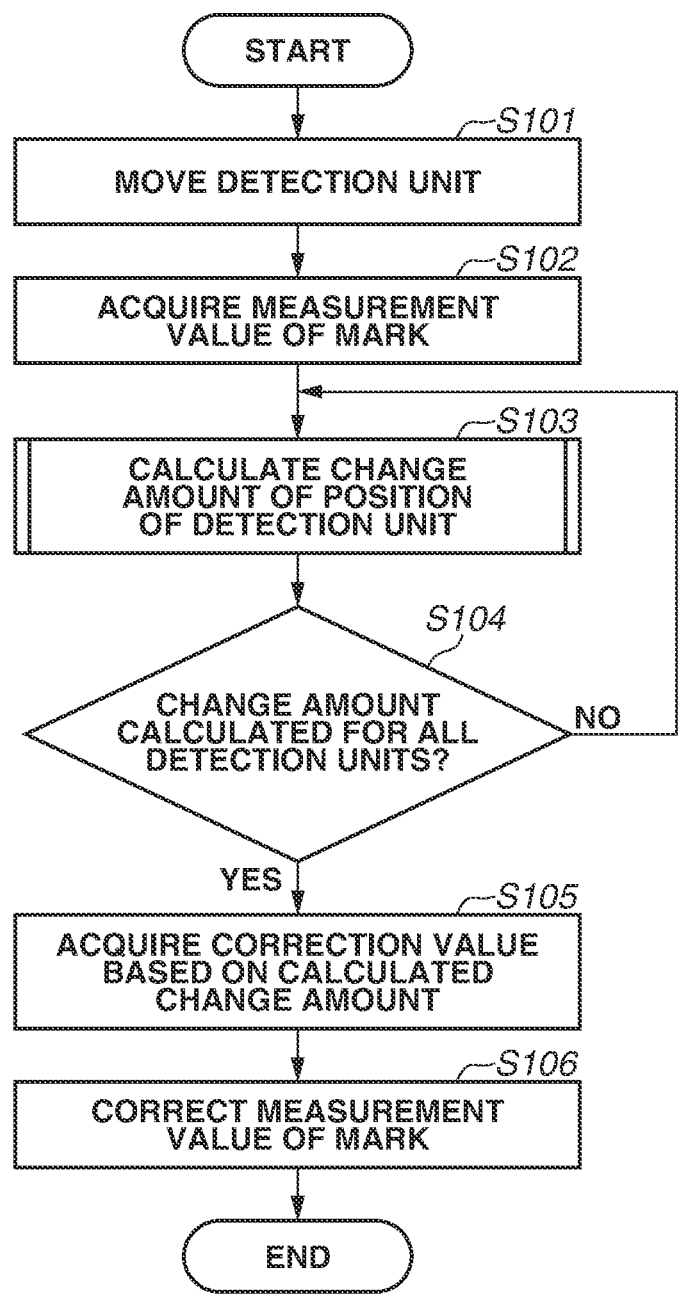
FIG. 10 is a flowchart illustrating a method for correcting a measurement value of a mark.

Next, a method for correcting the measurement value of the mark using the approximate expression in a case where the detection unit 21 moves is described. FIG. 10 is a flowchart illustrating the method for correcting the measurement value of the mark, where the method is executed by the control unit 1100.

In step S101, the control unit 1100 moves the detection unit 21. For example, in a case where the detection unit 21 is moved once, the control unit 1100 moves the detection unit 21 to a first position. For example, in a case where the detection unit 21 is moved twice, first, the control unit 1100 performs the first movement to move the detection unit 21 to the first position as the first time. Next, the control unit 1100 performs the second movement to move the detection unit 21 to a second position as the second time.

The control unit 1100 also acquires the information about the movement of the detection unit 21. Herein, the information about the movement of the detection unit 21 includes the time when the detection unit 21 completed the movement and the positions of the detection unit 21 before and after the movement. In a case where the detection unit 21 is moved a plurality of times, the information about the movement of the detection unit 21 includes the time when the detection unit 21 completed the movement and the positions of the detection unit 21 before and after the movement for each of the plurality of movements of the detection unit 21. In a case where the plurality of detection units 21 moves, the information about the movement of the detection unit 21 is acquired for each of the plurality of detection units 21 that have moved. If there is a detection unit 21 that has not moved from among the plurality of detection units 21, the control unit 1100 does not acquire information about the movement of the detection unit 21 that has not moved. In other words, the control unit 1100 only needs to acquire information about the movement of at least one of the plurality of detection units 21.

In step S102, the control unit 1100 causes the detection unit 21 to detect the mark and acquires a measurement value of the mark. At this time, in a case where the mark is detected by the plurality of detection units 21, the measurement value of the mark detected by each of the plurality of detection units 21 is acquired. The control unit 1100 also acquires the time when the mark is measured by the detection unit 21.

In step S103, the control unit 1100 calculates the amount of change in the position of at least one of the plurality of detection units 21. Here, the detection unit 21 whose amount of change in position is to be calculated is the detection unit 21 that has detected the mark whose measurement value is acquired in step S102 from among the plurality of detection units 21. The processing in step S103 is described in more detail below.

In step S104, the control unit 1100 determines whether the amount of change in the position is calculated for all of the detection units 21 whose amount of change in the position is to be calculated. In a case where it is determined that the amount of change in the position is calculated for all of the detection units 21 (YES in step S104), the control unit 1100 advances the processing to step S105. In a case where it is not determined that the amount of change in the position is calculated for all of the detection units 21 that have moved (NO in step S104), the control unit 1100 returns the processing to step S103 and calculates the amount of change in the position of the detection unit 21 whose amount of change in the position is not yet calculated.

In step S105, the control unit 1100 acquires the correction value for correcting the measurement value of the detection unit 21 based on the amount of change in the position of the detection unit 21 calculated in step S103. The control unit 1100 acquires the correction value for correcting the measurement value of the mark detected by each of the detection units 21 based on the amount of change in the position calculated for each of the plurality of detection units 21 in step S103.

In step S106, the control unit 1100 uses the correction value acquired in step S105 to correct the measurement value of the mark detected by the detection unit 21. In a case where the correction value for correcting the measurement value of the mark already exists, the control unit 1100 can update the existing correction value with the correction value acquired in step S105.

Then, the control unit 1100 performs alignment of the wafer 3 by controlling the wafer stage WS based on the corrected measurement values of the mark and forms the pattern on the wafer 3 by exposing the wafer 3 to the light.

Figure 11:
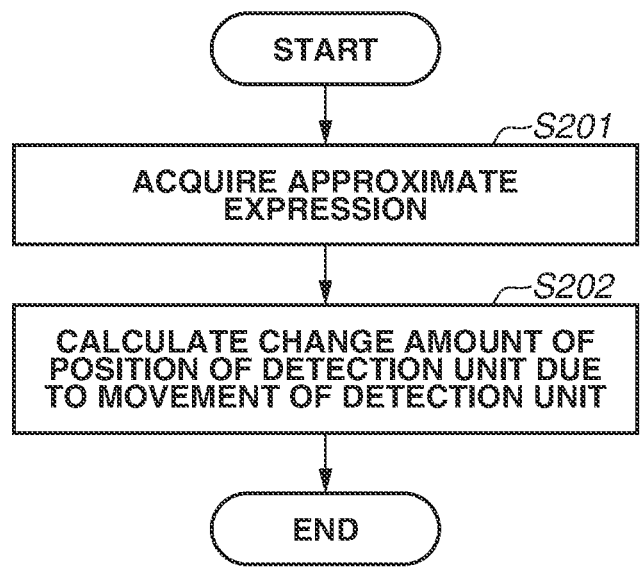
FIG. 11 is a flowchart illustrating a method for calculating an amount of change in position of the detection unit.

Next, the method for calculating the amount of change in the position of the detection unit 21 (in step S103) is described. FIG. 11 is a flowchart illustrating the method for calculating the amount of change in the position of the detection unit 21, where the method is executed by the control unit 1100.

In step S201, the control unit 1100 acquires the approximate expression for calculating the amount of change in the position of the detection unit 21 based on the information about the movement of the detection unit 21 acquired in step S102 and the approximate expression corresponding to the positions of the detection unit 21 before and after the movement.

For example, in a case where the detection unit 21 is moved once, the information about the movement of the detection unit 21 (first information) and the approximate expression fa(t) are acquired. For example, in a case where the detection unit 21 is moved twice, the approximate expression fx(t) is acquired using the information about the first movement of the detection unit 21, the information about the second movement of the detection unit 21 (second information), and the approximate expressions fa(t) and fb(t). For example, in a case where the detection unit 21 is moved three times, first, the approximate expression fx(t) is acquired in the same manner as described above, and then, the approximate expression fy(t) in the formula (3) is acquired using the information about the second and third movements of the detection unit 21 and the approximate expressions fc(t) and fx(t).

In step S202, the control unit 1100 uses the information about the movement of the detection unit 21 acquired in step S102 and the approximate expression acquired in step S201 to calculate the amount of change in the position of the detection unit 21.

In a case where the amount of change in the position of the detection unit 21 due to the influence of one movement of the detection unit 21 is calculated, the approximate expression fa(t) is used. For example, in a case where the amount of change in the position of the detection unit 21 due to the influence of two movements of the detection unit 21 is calculated, the approximate expression fx(t) is used. For example, in a case where the amount of change in the position of the detection unit 21 due to the influence of three movements of the detection unit 21 is calculated, the approximate expression fy(t) is used.

Specifically, the control unit 1100 calculates the amount of change in the position of the detection unit 21 using the information about the movement of the detection unit 21 and the approximate expression corresponding to each of a plurality of movements of the detection unit 21.

As described above, in the detection method according to the present exemplary embodiment, the measurement value of the mark is corrected based on the amount of change in the position of the detection unit calculated in consideration of the influence of the movement of the detection unit, thus enabling preventing a decrease in mark detection accuracy and increasing the time required for mark detection.

<Method for Manufacturing Article>

A method for manufacturing an article, such as a device (a semiconductor device, a magnetic storage medium, a liquid crystal display element, or the like), a color filter, or a hard disk will now be described. The manufacturing method includes a process for forming a pattern on a substrate (a wafer, a glass plate, a film substrate, or the like) using a lithography apparatus (for example, an exposure apparatus, an imprint apparatus, and a drawing apparatus). The manufacturing method includes a process for processing the substrate on which the pattern is formed (a processing step). The processing step can include a step for removing a residual layer of the pattern. The processing step can also include a step for etching the substrate using the pattern as a mask. The processing step can also include steps such as dicing, bonding, and packaging as other known steps. The method for manufacturing an article according to the present exemplary embodiment is advantageous in at least one of performance, quality, productivity, or production cost of the article compared with a conventional method.

The above-described exemplary embodiment uses an exposure apparatus as an example of the lithography apparatus, but this is not seen to be limiting. Other examples of the lithography apparatus can include, but are not limited to, an imprint apparatus that forms a pattern of an imprint material on a substrate using a mold (template) having a depression-protrusion pattern. An example of the lithography apparatus can also include a planarization apparatus that shapes a composition on a substrate to planarize the composition using a mold (planar template) having a planar portion without a depression-protrusion pattern. In still yet another example, the lithography apparatus can also include an apparatus such as a drawing apparatus that performs pattern formation on a substrate by performing drawing, on the substrate, with a charged particle beam (an electron beam, an ion beam, or the like) via a charged particle optical system.

According to aspects of the present disclosure, a detection method for preventing a decrease in accuracy of mark detection, a detection apparatus, a lithography apparatus, and a method for manufacturing an article are provided.

While exemplary embodiments have been provided, these embodiments are not seen to be limiting. The scope of the following claims is to be accorded the broadest interpretation so as to encompass all such modifications and equivalent structures and functions.

This application claims the benefit of Japanese Patent Application No. 2022-028463, filed Feb. 25, 2022, which is hereby incorporated by reference herein in its entirety.

What is claimed is:

1. A method for detecting a mark using a detection apparatus including a detection unit, the method comprising:
    acquiring position information for a first position of the detection unit;
    performing a first movement process that moves the detection unit from the first position to a second position, the first movement process ending at a first time;
    performing a second movement process that moves the detection unit from the second position to a third position, the second movement process ending at a second time later than the first time;
    calculating a correction value using a first approximate expression for the first movement process, a second approximate expression for the second movement process, the first time, and the second time;
    detecting the mark by the detection unit after completion of the second movement process; and
    correcting a measurement value of the detected mark using the calculated correction value.

2. The method according to claim 1, wherein the first approximate expression is based on the first position and the second position of the detection unit in the first movement process.

3. The method according to claim 1, wherein the second approximate expression is based on the second position and the third position of the detection unit in the second movement process.

4. The method according to claim 1, further comprising calculating an amount of change in a position of the detection unit after the movement of the detection unit in the second movement process is completed expression for calculating the amount of change in the position of the detection unit after the movement of the detection unit in the second movement process is completed based on the first approximate expression and the second approximate expression.

5. The method according to claim 4, wherein the expression is a combination of the first approximate expression for calculating the amount of change in the position of the detection unit due to the movement of the detection unit in the first movement process and the second approximate expression for calculating the amount of change in the position of the detection unit due to the movement of the detection unit in the second movement process.

6. The method according to claim 1, further comprising calculating an amount of change in the measurement value of the mark detected by the detection unit after the movement of the detection unit in the second movement process is completed using an expression for calculating the amount of change in the measurement value of the mark detected by the detection unit after the movement of the detection unit in the second movement process is completed based on the first approximate expression and the second approximate expression.

7. The method according to claim 6, wherein the expression is a combination of the first approximate expression for calculating the amount of change in the measurement value of the mark detected by the detection unit due to the movement of the detection unit in the first movement process and the second approximate expression for calculating the amount of change in the measurement value of the mark detected by the detection unit due to the movement of the detection unit in the second movement process.

8. A detection apparatus configured to detect a mark, the detection apparatus comprising:
a detection unit configured to detect the mark;
a moving unit configured to move the detection unit; and
a control unit configured to control the detection unit and the moving unit, wherein, in a case where the detection unit detects the mark after a first movement, for moving the detection unit from a first position to a second position, and a second movement, for moving the detection unit from the second position to a third position, are performed, the control unit corrects a measurement value of the mark detected by the detection unit using a first approximate expression for the movement of the detection unit in the first movement, a second approximate expression for the movement of the detection unit in the second movement, a first time for the first movement ending time, and a second time for the second movement ending time.

9. A lithography apparatus configured to form a pattern on a substrate, the lithography apparatus comprising the detection apparatus according to claim 8,
wherein the lithography apparatus forms the pattern on the substrate aligned based on a position of a mark on the substrate measured by the detection apparatus.

10. A method for manufacturing an article, the method comprising:
detecting a mark on a substrate using a detection apparatus including a detection unit;
aligning the substrate based on a measurement value of the mark detected in the detecting;
forming a pattern on the aligned substrate; and
manufacturing the article from the substrate on which the pattern is formed,
wherein detecting the mark on the substrate includes:
acquiring position information for a first position of the detection unit;
performing a first movement process for moving the detection unit from the first position to a second position, the first movement process ending at a first time;
performing a second movement process for moving the detection unit from the second position to a third position, the second movement process ending at a second time later than the first time;
calculating a correction value using a first approximate expression for the first movement process, a second approximate expression for the second movement process, the first time, and the second time;
detecting the mark by the detection unit after completion of the second movement process; and
correcting the measurement value of the mark detected by the detection unit using the calculated value.

\* \* \* \* \*